(12) United States Patent
Peng et al.

(10) Patent No.: US 12,445,099 B2
(45) Date of Patent: Oct. 14, 2025

(54) BIAS CIRCUIT OF POWER AMPLIFIER, DEVICE AND EQUIPMENT

(71) Applicant: SMARTER MICROELECTRONICS (GUANG ZHOU) CO., LTD., Guangzhou (CN)

(72) Inventors: Zhenfei Peng, Guangzhou (CN); Qiang Su, Guangzhou (CN); Xuwen Ni, Guangzhou (CN)

(73) Assignee: SMARTER MICROELECTRONICS (GUANG ZHOU) CO., LTD., Guangzhou (CN)

( * ) Notice: Subject to any disclaimer, the term of this patent is extended or adjusted under 35 U.S.C. 154(b) by 597 days.

(21) Appl. No.: 17/929,710

(22) Filed: Sep. 4, 2022

(65) Prior Publication Data

US 2023/0006623 A1    Jan. 5, 2023

Related U.S. Application Data

(63) Continuation of application No. PCT/CN2021/132876, filed on Nov. 24, 2021.

(30) Foreign Application Priority Data

Feb. 9, 2021  (CN) .......................... 202110182211.1

(51) Int. Cl.
  *H03F 1/56*  (2006.01)
  *H03F 3/193*  (2006.01)
  *H03F 3/24*  (2006.01)

(52) U.S. Cl.
  CPC .............. *H03F 3/245* (2013.01); *H03F 1/56* (2013.01); *H03F 3/193* (2013.01); *H03F 2200/18* (2013.01); *H03F 2200/451* (2013.01)

(58) Field of Classification Search
  CPC . H03F 3/245; H03F 3/193; H03F 3/20; H03F 1/56; H03F 1/301; H03F 1/565; H03F 1/30; H03F 2200/18; H03F 2200/451

(Continued)

(56) References Cited

U.S. PATENT DOCUMENTS 6,486,739 B1    11/2002  Luo
7,259,615 B2 *   8/2007  Sasho ..................... G05F 3/205
                                                    330/296

(Continued)

FOREIGN PATENT DOCUMENTS

CN    104426486 A    3/2015
CN    112994629 A    6/2021

OTHER PUBLICATIONS

China first office action in Application No. 202110182211.1, mailed on Apr. 6, 2022.

(Continued)

*Primary Examiner* — Andrea Lindgren Baltzell
*Assistant Examiner* — Nareh Shamiryan
(74) *Attorney, Agent, or Firm* — SYNCODA LLC; Feng Ma (57) ABSTRACT

A bias circuit of a power amplifier includes a first part circuit, a second part circuit and a power supply, in which the power supply is connected with a power supply end of the first part circuit; two ends of the first part circuit are connected in parallel with two ends of the second part circuit, and after parallel connection one end of a parallel circuit is connected with a gate of the first transistor of the power amplifier in a signal amplification circuit; the first part circuit is configured to provide a first bias voltage, and the second part circuit is configured to provide a second bias voltage; the two bias voltages are superimposed to provide (Continued)

a stable bias voltage; and an impedance of the bias circuit is in a preset range of the impedance.

9 Claims, 9 Drawing Sheets

(58) Field of Classification Search
USPC .......................................... 330/296, 285, 273
See application file for complete search history.

(56) References Cited

U.S. PATENT DOCUMENTS

| | | |
|---|---|---|
| 2001/0054933 A1 | 12/2001 | Miyazawa |
| 2015/0061770 A1* | 3/2015 | Luo .......................... H03F 3/193 |
| | | 330/288 |
| 2016/0308500 A1 | 10/2016 | Luo et al. |
| 2020/0244228 A1* | 7/2020 | Zihir ..................... H03F 1/3211 |

OTHER PUBLICATIONS

International Search Report in Application No. PCT/CN2021/132876, mailed on Feb. 10, 2022.

* cited by examiner

BIAS CIRCUIT OF POWER AMPLIFIER, DEVICE AND EQUIPMENT

CROSS-REFERENCE TO RELATED APPLICATIONS

This is a continuation of International Application No. PCT/CN2021/132876 filed on Nov. 24, 2021, which claims priority to Chinese Patent Application No. 202110182211.1 filed on Feb. 9, 2021. The disclosures of the above-referenced applications are hereby incorporated by reference in their entirety.

BACKGROUND

The bias circuit of radio frequency (RF) amplifier is configured to provide a stable direct current (DC) bias to a power transistor. For a MOS transistor amplifier, it mainly provides a DC bias voltage for the gate of the MOS transistor.

SUMMARY

The disclosure relates to electronic technologies, in particular to a bias circuit of a power amplifier, a device and equipment.

In a first aspect, is the disclosure provides a bias circuit of a power amplifier, which includes a first part circuit, a second part circuit and a power supply.

The power supply is connected with a power supply end of the first part circuit and configured to supply power to the first part circuit.

Two ends of the first part circuit are connected in parallel with two ends of the second part circuit, and one end of the parallel connection is connected with a gate of the first transistor of the power amplifier in a signal amplification circuit; the first part circuit is configured to provide a first bias voltage to the gate of the first transistor; the second part circuit is configured to provide a second bias voltage to the gate of the first transistor; the first bias voltage and the second bias voltage are superimposed to provide a stable bias voltage to the gate of the first transistor.

An impedance of the bias circuit is in a preset impedance range.

In some embodiments, the first part circuit includes a second transistor, a third transistor, a first resistor and a first capacitor, in which a drain of the second transistor is connected with the power supply, and a drain and a gate of the second transistor are connected to each other; a source of the second transistor is connected with one end of the second part circuit; the gate of the second transistor is connected to a gate of the third transistor through the first resistor, and is also connected to a ground terminal through the first capacitor; a drain of the third transistor is connected with the power supply, and a source of the third transistor is connected with the other end of the second part circuit and also connected with the gate of the first transistor.

In some embodiments, the first part circuit further comprises a second resistor, in which the second resistor is a variable resistor; the first capacitor is connected with the ground terminal through the second resistor.

In some embodiments, the power supply includes a current source, a first voltage source and a second voltage source; the first voltage source is connected with the drain of the third transistor; and the second voltage source is connected to the drain of the second transistor through the current source.

In some embodiments, the bias circuit further comprises a third resistor; the source of the third transistor is connected with the gate of the first transistor through the third resistor.

In some embodiments, the second part circuit includes a fourth transistor, a fifth transistor, a fourth resistor and a second capacitor; a drain of the fourth transistor is connected to one end of the first part circuit, and a source of the fourth transistor is grounded; a gate of the fourth transistor is connected with a gate of the fifth transistor, and is also connected with a ground terminal through the second capacitor; a drain of the fifth transistor is connected with a gate of the fifth transistor through the fourth resistor, and is also connected with the other end of the first part circuit; a source of the fifth transistor is grounded.

In some embodiments, the fourth resistor is a fixed resistor and the second capacitor is a fixed capacitor; or, the fourth resistor is a variable resistor and the second capacitor is a variable capacitor.

In some embodiments, the second transistor, the third transistor, the fourth transistor and the fifth transistor are transistors with the same structure.

In some embodiments, the signal amplification circuit further comprises a third capacitor, a fourth capacitor, an inductor and a third voltage source; the gate of the first transistor is connected with one end of the third capacitor, and the other end of the third capacitor is used as a signal input end; the drain of the first transistor is connected with the third voltage source through the inductor, and also connected with one end of the fourth capacitor, and the other end of the fourth capacitor is used as a signal output end; a source of the first transistor is grounded.

In a second aspect, the disclosure provides a power amplification device comprising a power amplifier and any one of the bias circuit of the above power amplifiers.

In a third aspect, the disclosure provides an electronic device including the power amplifying device.

The disclosure provides a bias circuit of a power amplifier, which comprises a first part circuit, a second part circuit and a power supply; the power supply is connected with the power supply end of the first part circuit for supplying power to the first part circuit; two ends of the first part circuit are connected in parallel with two ends of the second part circuit, and one end of the parallel connection is connected with a gate of the first transistor of the power amplifier in a signal amplification circuit; the first part circuit is configured to provide a first bias voltage to the gate of the first transistor; the second part circuit is configured to provide a second bias voltage to the gate of the first transistor; a superposition of the first bias voltage and the second bias voltage provides a stable bias voltage to the gate of the first transistor; an impedance of the bias circuit is within a preset impedance range. Therefore, the first part circuit provides the first bias voltage to the power amplifier, and the second part circuit provides the second bias voltage to the power amplifier. The second bias voltage can adjust the first bias voltage to provide the stable bias voltage to the power amplifier. In addition, the impedance of the bias circuit is in the preset impedance range, thus ensuring the linearity performance of the power amplifier and reducing the memory effect of the power amplifier.

DETAILED DESCRIPTION

In order to better understand the characteristics and technical contents of embodiments in this disclosure, the implementation of the embodiments will be described in detail below with reference to the drawings, which are only for reference and illustration, and do not intend to limit the embodiments.

Figure 1:
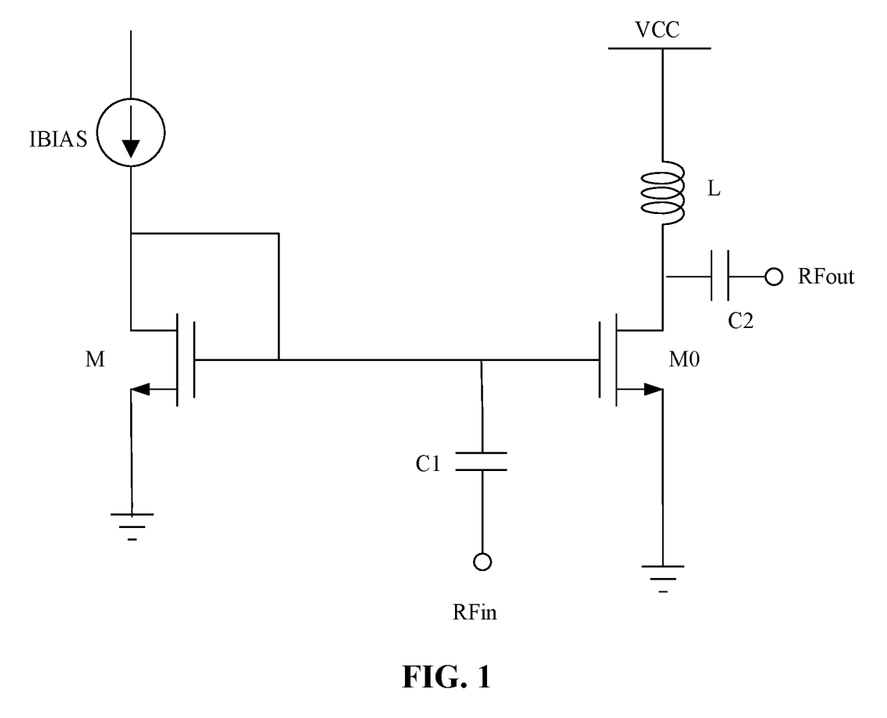
FIG. 1 is a schematic structural diagram of the structure of a bias circuit of a power amplifier in some implementations.

FIG. 1 is a schematic diagram of a structure of a bias circuit in some implementations. As shown in FIG. 1, a bias circuit includes a transistor M and a current source IBIAS. The particularly connections are as follows. The drain of the transistor M is connected with the current source IBIAS, the source of the transistor M is grounded, and the drain of the transistor M is short-circuited with the gate. The gate of the M transistor is connected to the gate of the transistor M0 of the power amplifier and is configured to provide a bias voltage for the gate of the M0 transistor. The transistor M0 is included in a signal amplification circuit for amplifying an input signal. The signal amplification circuit further includes a capacitor C1, a capacitor C2, a voltage source VCC and an inductor L. The specific connection mode of the signal amplification circuit is as follows. The gate of M0 transistor is connected with one end of capacitor C1, and the other end of capacitor C1 is used as the RF signal input end. The drain of the transistor M0 is connected to the voltage source VCC through the inductor L and also connected to one end of the capacitor C2, the other end of the capacitor C2 is used as the RF signal output end, and the source of the transistor M0 is connected to a ground terminal. Based on the above bias circuit, since the transistor M is connected as a diode and the diode is a nonlinear component, the nonlinear effect causes the gate-source voltage of the transistor M to decrease with the increase of the power of the input RF signal, that is, the bias voltage provided to the transistor M0 decreases, and then leads to the deterioration of the linearity of the transistor M0.

Figure 2:
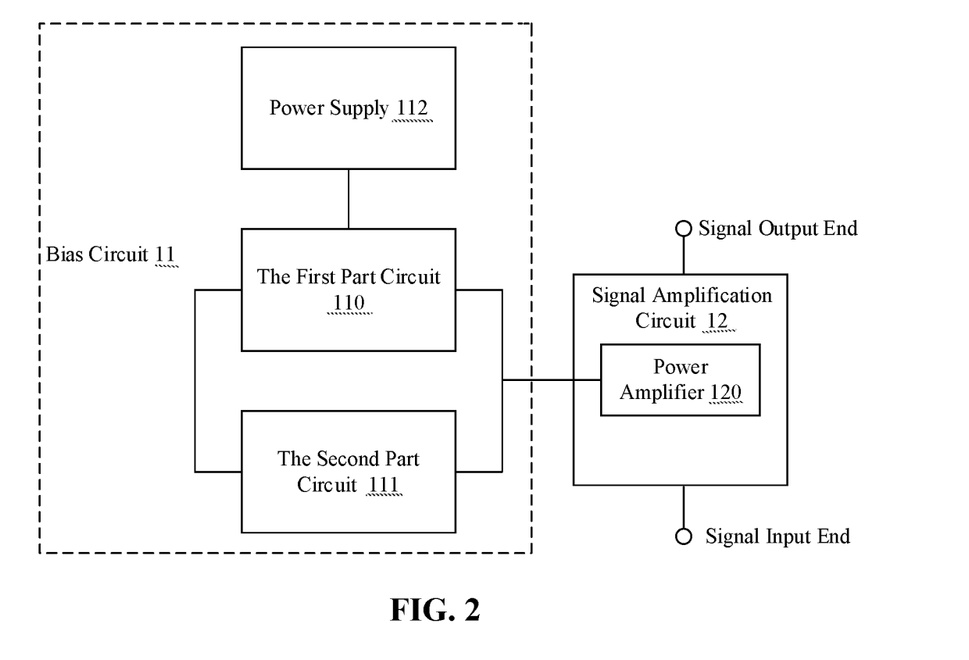
FIG. 2 is a schematic structural diagram of the first composition of a bias circuit of a power amplifier of an embodiment of this disclosure.

The embodiments of this disclosure provide a bias circuit of a power amplifier. FIG. 2 is a schematic structure diagram of a first structure of a bias circuit of a power amplifier of an embodiment of this disclosure. As shown in FIG. 2, the bias circuit 11 includes a first part circuit 110, a second part circuit 111 and a power supply 112.

The power supply 112 is connected with a power supply terminal of the first part circuit 110, and is configured to supply power to the first part circuit 110.

The two ends of the first part circuit 110 are connected in parallel with the two ends of the second part circuit 111, and one end of the parallel connected circuit is connected with the gate of the first transistor of the power amplifier 120 in the signal amplification circuit 12; the first part circuit 110 is configured to provide a first bias voltage to the gate of the first transistor; the second part circuit 111 is configured to provide a second bias voltage to the gate of the first transistor; the first bias voltage and the second bias voltage are superimposed to provide a stable bias voltage for the gate of the first transistor.

The impedance of the bias circuit is in a preset impedance range.

The first part circuit 110 is configured to provide a first bias voltage to the power amplifier 120, and the second part circuit 111 is configured to provide a second bias voltage to the power amplifier 120. When power of the RF signal input to the power amplifier 120 increases, the first bias voltage increases and the second bias voltage decreases, or alternatively, the first bias voltage decreases and the second bias voltage increases. The first bias voltage is adjusted by the second bias voltage, so as to provide a stable bias voltage to the power amplifier 120, thereby ensuring the linearity performance of the power amplifier 120.

It should be noted, the preset impedance range refers to the range that cannot cause the linearity of the power amplifier to deteriorate. The preset impedance range can be smaller than the impedance Z1 of the bias circuit in FIG. 1, that is Z1=1/gm, where gm is the transconductance of the transistor M. When the impedance of the bias circuit is low, the linearity performance of the power amplifier can be guaranteed.

It should be noted, the first part circuit 110 and the second part circuit 111 also include other matching elements, such as one of or a combination of more of resistors, capacitors and transistors. The first part circuit 110 and the second part circuit 111 including one of or a combination of more of the elements provide a stable bias voltage to the power amplifier after superposition of the first bias voltage of the first part circuit 110 and the second bias voltage of the second part circuit 111, and the impedance of the bias circuit 11 is within the preset impedance range, thus ensuring the linearity of the power amplifier 120, and further effectively amplifying the input RF signal.

In addition, the signal amplification circuit 12 of FIG. 2 includes a power amplifier 120, which is configured to amplify the RF signal input from the signal input end and output the amplified RF signal from the signal output end.

Therefore, the first part circuit provides the first bias voltage to the power amplifier, and the second part circuit provides the second bias voltage to the power amplifier. The second bias voltage can adjust the first bias voltage to provide a stable bias voltage to the power amplifier. The impedance of the bias circuit is in the preset impedance range, thus ensuring the linearity performance of the power amplifier and reducing the memory effect of the power amplifier.

Figure 3:
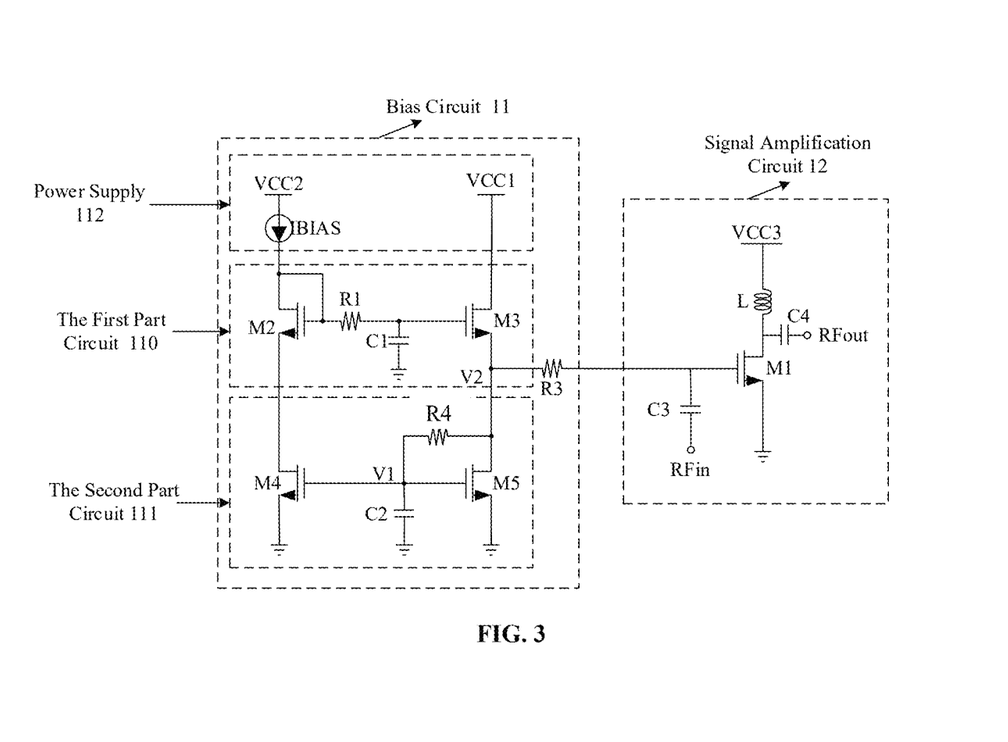
FIG. 3 is a schematic structural diagram of the second structure of a bias circuit of a power amplifier of an embodiment of this disclosure.

In view of the schematic structural diagram of the first composition of the bias circuit of the power amplifier in FIG. 2, this disclosure provides a specific circuit structural diagram, and FIG. 3 is the schematic structural diagram of the second composition of a bias circuit of a power amplifier of an embodiment of this disclosure.

As shown in FIG. 3, the bias circuit 11 of the power amplifier includes the first part circuit 110, the second part circuit 111 and the power supply 112.

The power supply 112 includes a current source IBIAS, a first voltage source VCC1 and a second voltage source VCC2. Herein, the power is supplied to IBIAS through VCC2.

The first part circuit 110 includes a second transistor M2, a third transistor M3, a first resistor R1 and a first capacitor C1.

The specific connection mode is as follows: the drain of the transistor M2 is connected with VCC2 through IBIAS, and the drain and the gate of the transistor M2 is connected with each other; the source of the transistor M2 is connected to one end of the second part circuit 111 (that is, connected with the drain of a transistor M4); the gate of the transistor M2 is connected with the gate of the transistor M3 through R1, and also connected with the ground terminal through C1; the drain of the transistor M3 is connected to VCC1, and the source of the transistor M3 is connected to the other end of the second part circuit 111 (that is, connect to the drain of a transistor M5) and the gate of a transistor M1.

The transistor M2 and the transistor M3 constitute a current mirror structure. R1 and C1 between the transistor M2 and the transistor M3 form a low-pass network circuit, to isolate the RF signal from being coupled into the bias current circuit, that is, to avoid affecting the transistor M2, thereby ensuring that the gate voltage of the transistor M2 remains unchanged. Since the gate voltage of the transistor M2 is equal to that of the transistor M3, the gate voltage of the transistor M3 remains unchanged.

It should be noted, in the first part circuit, the gate and drain of the transistor M2 are connected, that is, the transistor M2 is a nonlinear component. Therefore, the first part circuit is a nonlinear circuit. Due to the nonlinearity of the transistor M3 in the first part circuit and the RF signal on the gate-source voltage of the transistor M3, when power of the input RF signal is high, the gate-source voltage of the transistor M3 decreases.

Herein, the gate-source voltage of the transistor M3 is equal to the gate voltage of the transistor M3 minus the source voltage. The gate-source voltage of the transistor M3 decreases and the gate voltage of the transistor M3 remains unchanged. Therefore, the source voltage of the transistor M3 increases. That is, the first part circuit increases the voltage of V2 node.

The second part circuit 111 includes a fourth transistor M4, a fifth transistor M5, a fourth resistor R4 and a second capacitor C2.

The specific connection mode is as follows: the drain of the transistor M4 is connected to one end of the first part circuit 110 (that is, to the source of the transistor M2), and the source of the transistor M4 is grounded; the gate of the transistor M4 is connected with the gate of the transistor M5, and also connected with the ground terminal through C2; the drain of the transistor M5 is connected to the gate of the transistor M5 through R4, and is also connected to the other end of the first part circuit 110 (that is, to the source of the transistor M3). The source of the transistor M5 is grounded.

It should be noted, the transistor M4 and the transistor M5 constitute a current mirror structure. R4 and C2 constitute a low-pass network circuit, to reduce the gate voltage of the transistor M5. Specifically, the drain of the transistor M5 is connected to its gate through R4, that is, the transistor M5 is connected as a diode and is a nonlinear component, so the nonlinear effect causes the gate-source voltage of the transistor M5 to decrease with the increase of input RF signal power. Since the gate voltage of the transistor M5 is equal to the drain voltage and the source voltage is equal to zero, the gate voltage of the transistor M5 (that is, the voltage of V1 node) decreases, that is, the second part circuit reduces the voltage of V2 node.

Herein, the first part circuit increases the voltage of the V2 node, and the second part circuit decreases the voltage of the V2 node. When the voltage rise and fall of the two part circuits are designed to have the same extent of influence, by superimposing the two influences, V2 node can present a stable DC bias voltage.

Figure 4:
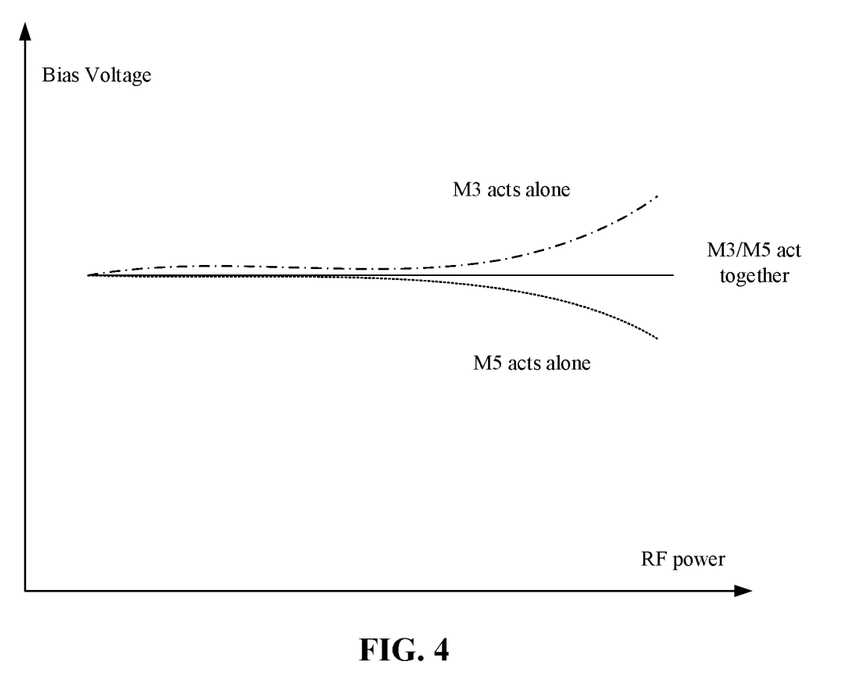
FIG. 4 is a schematic diagram of the relationship between the RF power and the bias voltage of an embodiment of this disclosure.

Based on the above description, FIG. 4 is a schematic diagram of the relationship between RF power and bias voltage of an embodiment of this disclosure. As shown in FIG. 4, with the increase of RF power, the bias voltage of V2 node increases when the transistor M3 acts alone, while when the transistor M5 acts alone, the bias voltage of V2 node decreases; and when the transistors M3 and M5 act together, V2 node has a stable DC bias voltage.

In addition, the transistor M2, the transistor M3, the transistor M4 and the transistor M5 constitute a closed loop and realize a low output impedance, and the impedance of V2 node (that is, the impedance of bias circuit) is $Z2=1/(gm3+gm5)(1+A)$, in which gm3 is the transconductance of the transistor M3, gm5 is the transconductance of the transistor M5, and A is the typical value of loop gain of about 100.

Figure 5:
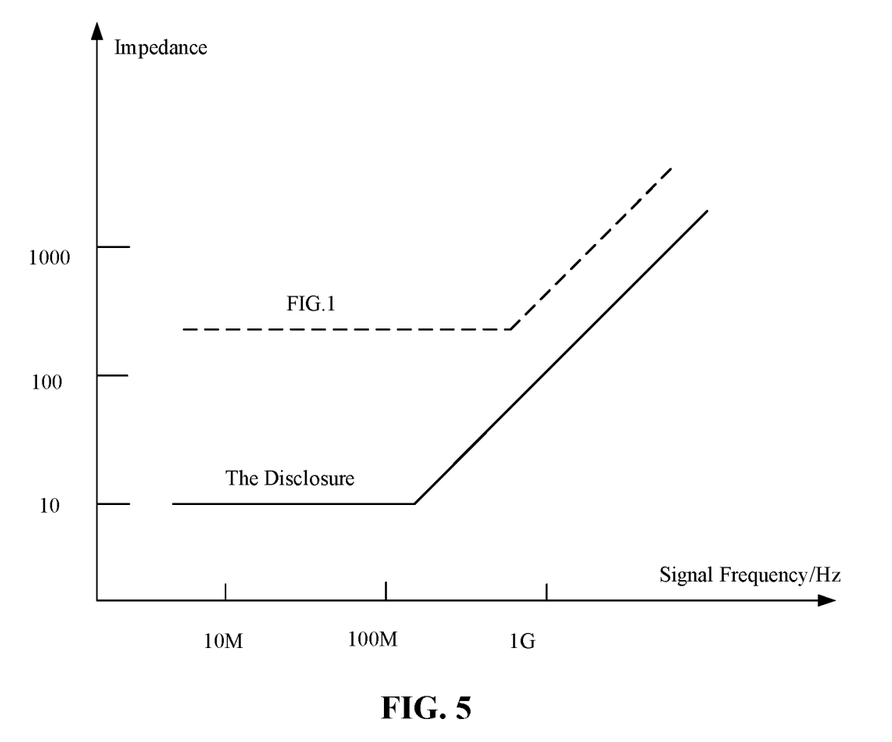
FIG. 5 is a schematic diagram of the comparison result between the impedance of a bias circuit of an embodiment of this disclosure and the impedance of a bias circuit in some implementations.

FIG. 5 is a schematic diagram of the comparison result between an impedance of a bias circuit of an embodiment of this disclosure and that of a bias circuit in some implementations. As shown in FIG. 5, an impedance of a bias circuit in this disclosure is lower than that of the bias circuit in some implementations (that is, the impedance of FIG. 1).

The bias circuit also includes a third resistor R3.

Herein, the source of the transistor M3 is connected to the gate of the transistor M1 through R3, and the drain of the transistor M5 is connected to the gate of the transistor M1 through R3.

It should be noted, R3 is added to adjust the impedance frequency characteristics of the gate node of the transistor M1, so that the transistor M1 has the best linearity. Herein, the value of R3 is usually of more than ten and less than twenty ohms.

The signal amplifying circuit 12 also includes a third capacitor C3, a fourth capacitor C4, an inductor L and a third voltage source VCC3.

The specific connection mode is as follows: the gate of the transistor M1 is connected with one end of C3, and the other end of C3 is used as the signal input end; the drain of the transistor M1 is connected with VCC2 through L, and also connected with one end of C4, the other end of C4 is used as the signal output end; the source of the transistor M1 is grounded.

Herein, it should be noted, the transistors M2, M3, M4 and M5 mentioned above are transistors with the same structure. In addition, the transistor M1 may or may not have the same structure as the transistors M2, M3, M4 and M5.

Figure 6:
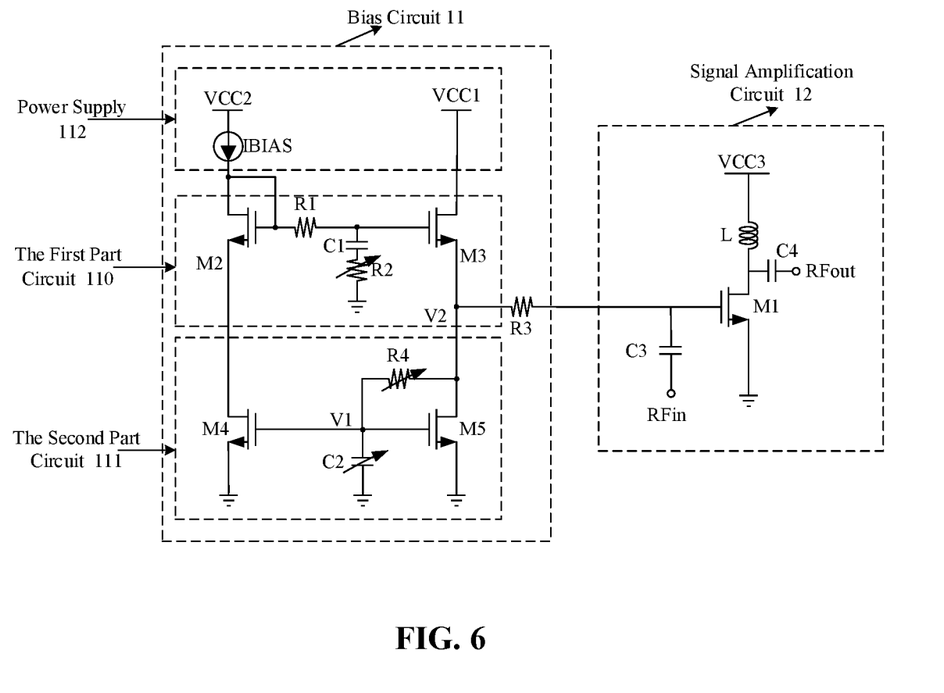
FIG. 6 is a schematic structural diagram of the third composition of a bias circuit of a power amplifier of an embodiment of this disclosure.

Based on the schematic structural diagram of the first composition of the bias circuit of the power amplifier in FIG. 2, the disclosure also provides a specific circuit structural diagram, and FIG. 6 is the schematic structural diagram of the third composition of a bias circuit of a power amplifier of an embodiment of the disclosure.

As shown in FIG. 6, the bias circuit 11 of the power amplifier includes the first part circuit 110, the second part circuit 111 and the power supply 112.

The power supply 112 includes a current source IBIAS, a first voltage source VCC1 and a second voltage source VCC2. Herein, power is supplied to IBIAS through VCC2.

The first part circuit 110 includes a second transistor M2, a third transistor M3, a first resistor R1, a first capacitor C1 and a second resistor R2. R2 is a variable resistor.

The specific connection mode is as follows: the drain of the transistor M2 is connected with VCC2 through IBIAS, and the drain of the transistor M2 is connected with its gate; the source of the transistor M2 is connected to one end of the second part circuit 111 (that is, to the drain of the transistor M4); the gate of the transistor M2 is connected with the gate of the transistor M3 through R1, and connected with the ground terminal through C1 and R2 in series. The drain of the transistor M3 is connected to VCC1, and the source of the transistor M3 is connected to the other end of the second circuit 111 (that is, to the drain of the transistor M5) and the gate of the transistor M1.

Figure 7:
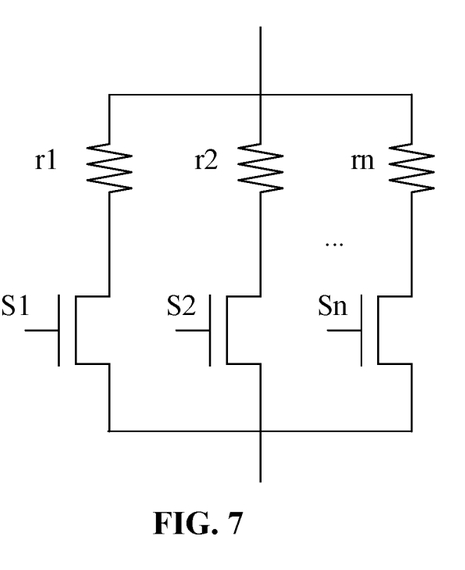
FIG. 7 is a schematic structural diagram of a variable resistor of an embodiment of this disclosure.

FIG. 7 is a schematic structural diagram of a variable resistor in the embodiments of this disclosure. As shown in FIG. 7, the variable resistor includes n resistors r and n switches S. The specific connection mode is as follows: r1 and S1 are connected in series, and then connected in parallel at both ends of r2 and S2 which are connected in series, and repeat, and then connected in parallel at both ends of rn and Sn which are connected in series.

It should be noted, the variable resistor R2 connected in series with C1 can control the effect of voltage increase of V2 node on the transistor M3. For example, increasing R2 can reduce the extent of increase of the bias voltage of V2 node.

The second part circuit 111 includes a fourth transistor M4, a fifth transistor M5, a fourth resistor R4 and a second capacitor C2. R4 is a variable resistor and C2 is a variable capacitor.

The specific connection mode is as follows: the drain of the transistor M4 is connected to one end of the first part circuit 110 (that is, to the source of the transistor M2), and the source of the transistor M4 is grounded; the gate of the transistor M4 is connected with the gate of the transistor M5, and also connected with the ground terminal through C2; the drain of the transistor M5 is connected to the gate of the transistor M5 through R4, and is also connected to the other end of the first part circuit 110 (that is, to the source of The transistor M3); and the source of the transistor M5 is grounded.

Figure 8:
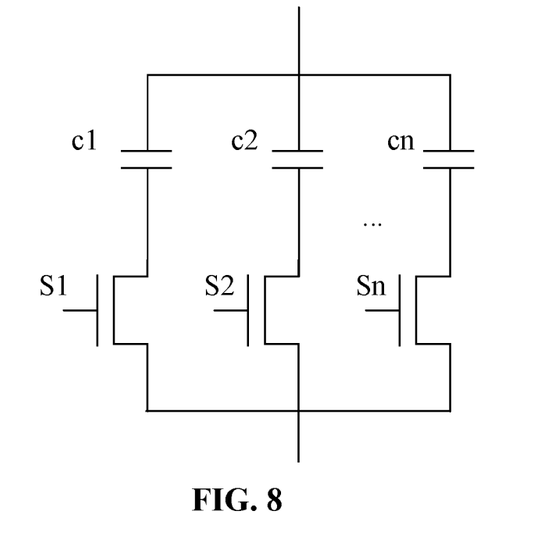
FIG. 8 is a schematic structural diagram of a variable capacitor of an embodiment of this disclosure.

FIG. 8 is a schematic structural diagram of a variable capacitor of an embodiment of this disclosure. As shown in FIG. 8, the variable capacitor includes n capacitors c and n switches S. The specific connection mode is as follows: c1 and S1 are connected in series, and then are connected in parallel at both ends of c2 and S2 which are connected in series, and repeat, and at last connected in parallel at both ends of cn and Sn which are connected in series.

It should be noted, R4 is a variable resistor and C2 is a variable capacitor. By changing the values of R4 and C2, the voltage reduction of V2 node of the transistor M5 can be controlled. For example, increasing R4 and C2 can reduce the bias voltage reduction effect of V2 node.

Based on the above embodiments, by adjusting the values of R2, R4 and C2, the bias voltage can be controllably increased or decreased with the increase of RF signal power. The optimal linear characteristics can be achieved by selecting appropriate bias voltage characteristics in the power amplifier.

The bias circuit further includes a third resistor R3.

Herein, the source of the transistor M3 is connected to the gate of the transistor M1 through R3, and the drain of the transistor M5 is connected to the gate of the transistor M1 through R3.

It should be noted, by increasing R3, the impedance-frequency characteristic of the gate node of the transistor M1 is adjusted, so that the transistor M1 has the best linearity. Herein, R3 usually takes a value of more than ten and no more than twenty ohms.

The signal amplifying circuit 12 also includes a third capacitor C3, a fourth capacitor C4, an inductor L and a third voltage source VCC3.

The specific connection mode is as follows: the gate of the transistor M1 is connected with one end of C3, and the other end of C3 is used as a signal input end; the drain of the transistor M1 is connected with VCC2 through L, and also connected with one end of C4, the other end of C4 is used as a signal output end; and the source of M1 is grounded.

Figure 9:
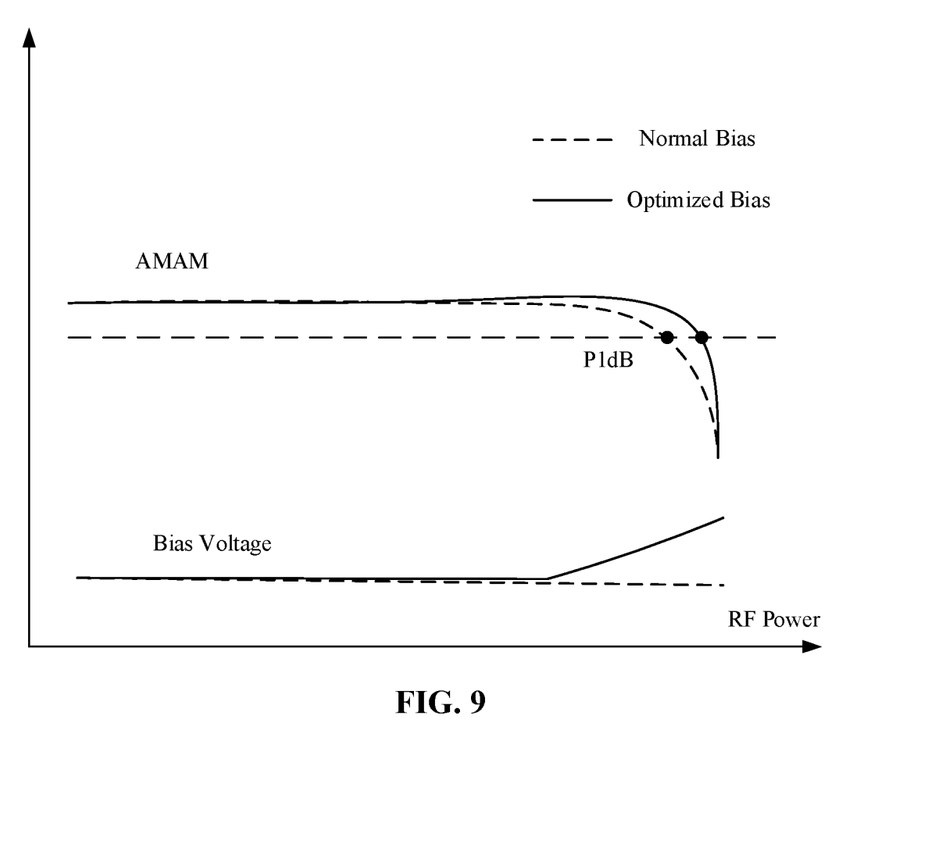
FIG. 9 is a schematic diagram of the relationship between a RF power and gain amplitude and the relationship between a RF power and a bias voltage of an embodiment of this disclosure.

FIG. 9 is a schematic diagram of the relationship between the RF power and gain amplitude and the relationship between RF power and bias voltage in an embodiment of this disclosure. As shown in FIG. 9, the abscissa is RF power, and the upper curves show the relationship between RF power and gain amplitude (that is, AMAM) of the power amplifier. From the AMAM curve, the 1 dB power compression point P 1 dB can be obtained, which can be used as a measurement index of the linearity of the power amplifier. The dotted line (i.e. normal bias) corresponds to the bias circuit having the fixed resistor and capacitor (i.e. R4 and C2 in the circuit of FIG. 3), and the solid line (i.e. optimized bias) corresponds to the bias circuit having the variable resistors and variable capacitor (i.e. R2, R4 and C2 in the circuit of FIG. 6). The lower curves show the relationship between RF power and bias voltage. The dotted line corresponds to the bias circuit having the fixed resistors and capacitors (i.e., normal bias), and the solid line corresponds to the bias circuit having the fixed of variable resistors and capacitors in (i.e. optimized bias).

As shown in FIG. 9, under the conventional bias, with the increase of RF power, the bias voltage remains unchanged and AMAM decreases. Under the optimized bias, by adjusting variable resistors and capacitors in the bias circuit, with the increase of RF power, the bias voltage increases, and AMAM also increases, thereby increasing the linearity of the power amplifier.

In addition, setting the variable resistors and capacitors is mainly to increase the flexibility of adjusting the linear power of the bias circuit. After the power amplifier is manufactured, the resistance and capacitance values with better linearity can be selected by digital control. For example, the power amplifier can work at different frequencies, and the resistance and capacitance with the optimal linearity are different at different frequencies. When using variable resistors and capacitors, the power amplifier can obtain the best linearity performance by setting different resistance and capacitance values at different frequencies.

The embodiments of this disclosure also provide a power amplification device, which comprises a power amplifier and any one of the bias circuit of the power amplifiers in the above embodiments.

The embodiments of the disclosure also disclose an electronic device, which comprises the power amplification device of the above embodiments of the disclosure.

The disclosure provides a bias circuit of a power amplifier, device and equipment. The circuit includes a first part circuit, a second part circuit and a power supply. The power supply is connected with a power supply end of the first part circuit. Two ends of the first part circuit are connected in parallel with two ends of the second part circuit, and after parallel connection one end of a parallel circuit is connected with a gate of the first transistor of the power amplifier in a signal amplification circuit. The first part circuit is configured to provide a first bias voltage, and the second part circuit is configured to provide a second bias voltage. The two bias voltages are superimposed to provide a stable bias voltage. An impedance of the bias circuit is in a preset impedance range. Therefore, the first circuit provides the first bias voltage for the power amplifier, and the second circuit provides the second bias voltage for the power amplifier. The second bias voltage can adjust the first bias voltage to provide the stable bias voltage for the power amplifier. In addition, the impedance of the bias circuit is in the preset range of the impedance, thus ensuring the linearity performance of the power amplifier and reducing the memory effect of the power amplifier.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

What is claimed is:

1. A bias circuit of a power amplifier, comprising a first part circuit, a second part circuit, and a power supply, wherein
    the power supply is connected with a power supply end of the first part circuit and configured to supply power to the first part circuit;
    two ends of the first part circuit are connected in parallel with two ends of the second part circuit, one end of the parallel connection is connected with a gate of a first transistor of the power amplifier in a signal amplification circuit, the first part circuit is configured to provide a first bias voltage to the gate of the first transistor, the second part circuit is configured to provide a second bias voltage to the gate of the first transistor, and the first bias voltage and the second bias voltage are superimposed to provide a stable bias voltage to the gate of the first transistor; and
    an impedance of the bias circuit is in a preset impedance range;
    wherein
    the first part circuit comprises a second transistor, a third transistor, a first resistor, a second resistor, and a first capacitor
    a drain of the second transistor is connected with the power supply, and the drain and a gate of the second transistor are connected to each other; a source of the second transistor is connected with one end of the second part circuit; the gate of the second transistor is connected to a gate of the third transistor through the first resistor, and is also connected to a ground terminal through the first capacitor;
    a drain of the third transistor is connected with the power supply, and a source of the third transistor is connected with another end of the second part circuit and also connected with the gate of the first transistor;
    the second resistor is a variable resistor; and
    the first capacitor is connected with the ground terminal through the second resistor.

2. The bias circuit of claim 1, wherein,
    the power supply comprises a current source, a first voltage source and a second voltage source;
    the first voltage source is connected with the drain of the third transistor; and
    the second voltage source is connected to the drain of the second transistor through the current source.

3. The bias circuit of claim 1, wherein,
    the bias circuit further comprises a third resistor; and
    the source of the third transistor is connected with the gate of the first transistor through the third resistor.

4. The bias circuit of claim 1, wherein,
    the second part circuit comprises a fourth transistor, a fifth transistor, a fourth resistor and a second capacitor;
    a drain of the fourth transistor is connected to one end of the first part circuit, and a source of the fourth transistor is grounded; a gate of the fourth transistor is connected with a gate of the fifth transistor, and is also connected with a ground terminal through the second capacitor; and
    a drain of the fifth transistor is connected with the gate of the fifth transistor through the fourth resistor, and is also connected with another end of the first part circuit; a source of the fifth transistor is grounded.

5. The bias circuit of claim 4, wherein,
    the fourth resistor is a fixed resistor and the second capacitor is a fixed capacitor; or
    the fourth resistor is a variable resistor and the second capacitor is a variable capacitor.

6. The bias circuit of claim 1, wherein,
    the signal amplification circuit further comprises a third capacitor, a fourth capacitor, an inductor and a third voltage source; and
    the gate of the first transistor is connected with one end of the third capacitor, and another end of the third capacitor is used as a signal input end; the drain of the first transistor is connected with the third voltage source through the inductor, and also connected with one end of the fourth capacitor, and the another end of the fourth capacitor is used as a signal output end; a source of the first transistor is grounded.

7. A power amplification device, comprising a power amplifier and the bias circuit of the power amplifier according to claim 1.

8. An electronic device, comprising:
    the power amplifying device according to claim 7.

9. The electronic device of claim 8, wherein
    the first part circuit provides the first bias voltage to the power amplifier;
    the second part circuit provides the second bias voltage to the power amplifier;
    the second bias voltage is configured to adjust the first bias voltage to provide the stable bias voltage to the power amplifier; and
    the impedance of the bias circuit is in the preset impedance range to thereby ensure linearity performance of the power amplifier and reduce memory effect of the power amplifier.

* * * * *